(12) United States Patent
Chung et al.

(10) Patent No.: US 6,841,798 B2
(45) Date of Patent: Jan. 11, 2005

(54) ENCLOSED CAVITY FORMED INSIDE A GATE LINE OF A THIN FILM TRANSISTOR AND FABRICATION METHOD THEREOF

(75) Inventors: Te-Cheng Chung, Taoyuan Hsien (TW); Tean-Sen Jen, Taoyuan Hsien (TW); Ming-Tien Lin, Taipei Hsien (TW); Seok Lyul Lee, Taoyuan Hsien (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 10/352,013

(22) Filed: Jan. 27, 2003

(65) Prior Publication Data
US 2004/0012023 A1 Jan. 22, 2004

(30) Foreign Application Priority Data
Jul. 16, 2002 (TW) .................................. 91115787 A

(51) Int. Cl.⁷ .................. G02F 1/13; H01L 21/768; H01L 21/84; H01L 29/04; H01L 31/36
(52) U.S. Cl. .......................... 257/72; 257/59; 257/66; 349/38; 349/39; 349/42
(58) Field of Search .............................. 257/55, 57, 59, 257/66, 71, 72, 88, 292, 336, 339, 347, 350, 352, 448, 763; 349/38–44, 46; 438/158, 30

(56) References Cited

U.S. PATENT DOCUMENTS 5,852,482 A * 12/1998 Kim ............................. 349/46
5,969,778 A * 10/1999 Oh et al. ...................... 349/43

\* cited by examiner

Primary Examiner—Minhloan Tran
Assistant Examiner—Thomas L Dickey
(74) Attorney, Agent, or Firm—Thomas, Kayden, Horstemeyer & Risley

(57) ABSTRACT

A thin film transistor liquid crystal display. At least a gate line and a data line define at least one pixel area. An enclosed cavity is formed in the gate line to separate the gate line into a first gate region and a second gate region. A thin film transistor has a gate electrode that is the first gate region or the second gate region, a source electrode that is an extension of the data line and is over the enclosed cavity, and a drain electrode. A pixel electrode covers the pixel area and is electrically connected to the drain electrode.

10 Claims, 13 Drawing Sheets

ENCLOSED CAVITY FORMED INSIDE A GATE LINE OF A THIN FILM TRANSISTOR AND FABRICATION METHOD THEREOF

BACKGROUND OF THE INVENTION

1. Field of the Invention

The present invention relates to a thin film transistor liquid crystal display and, more particularly, to a thin film transistor liquid crystal display having a high aperture ratio.

2. Description of the Related Art

Currently, a liquid crystal display (LCD) with the advantages of low power consumption, thin thickness, light weight, and low driving voltage, has been put to many uses, such as personal computers, navigation systems, projectors, viewfinders and portable devices (watches, electronic calculators, and televisions).

Depending on the dielectric anisotropy and conductive anisotropy of the liquid crystal (LC) molecules, when an electric field is applied on the LCD, the alignment of the LC molecules is changed to display images. In active matrix LCD technology, a thin film transistor (TFT) is employed as a switch device in a TFT-LCD, and has the advantages of low power consumption, light weight, and low driving voltage.

FIG. 1 is a plane view showing a layout of a conventional TFT-LCD. In the TFT-LCD, a TFT structure comprises a gate electrode protruding from a gate line 120 and a source/drain electrode 180. Also, an ITO layer 200 is patterned on a pixel area and covers a part of the gate line 120. Particularly, since the gate electrode and the source/drain electrode 180 extend toward the pixel area, the TFT structure is viewed as a stretching-tongue type. As the TFT-LCD is continuously developed toward a high resolution, a high luminescence, a thinner form, a lighter weight and a smaller size, however, the aperture ratio of the TFT-LCD becomes smaller and smaller, resulting in a decreased transmittance. The pixel capacitance also becomes smaller to increase the coupling capacitance (Cgs is used as a symbol for the coupling capacitance in FIG. 1) generated between the gate electrode and the drain electrode, resulting in a deteriorated image performance. Thus, a method of increasing the aperture ratio and decreasing the coupling capacitance solving the aforementioned problems is called for.

SUMMARY OF THE INVENTION

The object of the present invention is to provide a TFT-LCD having an increased aperture ratio and a decreased coupling capacitance to solve the aforementioned problems caused by the conventional TFT-LCD.

A thin film transistor liquid crystal display comprises a substrate with a first metal layer patterned thereon serves as at least a traverse-extending gate line, wherein an enclosed cavity is formed in the gate line to separate the gate line into a first gate region and a second gate region, and a part of the first gate region serves as a gate electrode, a stacked structure comprising a dielectric layer, a first semiconductor layer, an etching stop layer and a second semiconductor layer is sequentially formed over the gate electrode, in which the etching stop layer is in a position corresponding to the gate electrode, a second metal layer patterned on the substrate serves as at least a lengthwise-extending data line, a source electrode on the stacked structure and over the enclosed cavity, and a drain electrode on the stacked structure, wherein an opening passing through the second metal layer separates the source electrode and the drain electrode, and the opening passing through the second semiconductor layer separates the second semiconductor layer into a source diffusion region and a drain diffusion region, a protection layer is deposited on the entire surface to fill the opening, in which a contact hole is formed in the protection layer to expose a part of the drain electrode, and a transparent conductive layer is deposited on the entire surface to fill the contact hole and patterned as a pixel electrode electrically connected to the drain electrode through the contact hole.

Accordingly, it is a principal object of the invention to provide an enclosed cavity in the gate line to increase the aperture ratio of the TFT-LCD.

It is another object of the invention to provide most of the source electrode over the enclosed cavity to decrease parasitic capacitance generated between the source electrode and the gate electrode.

Yet another object of the invention is to decrease the RC time delay.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE INVENTION

FIGS. 2A to 2E are plane views showing a method of forming a TFT-LCD according to the present invention, in which only the main material layers are shown to facilitate the known layout of the TFT-LCD. FIGS. 3A to 3G are sectional views along line II–II' of FIG.2 to show a method of forming a TFT-LCD according to the present invention, in which only the main material, layers are shown to facilitate the known structure of the TFT-LCD.

Figure 1:
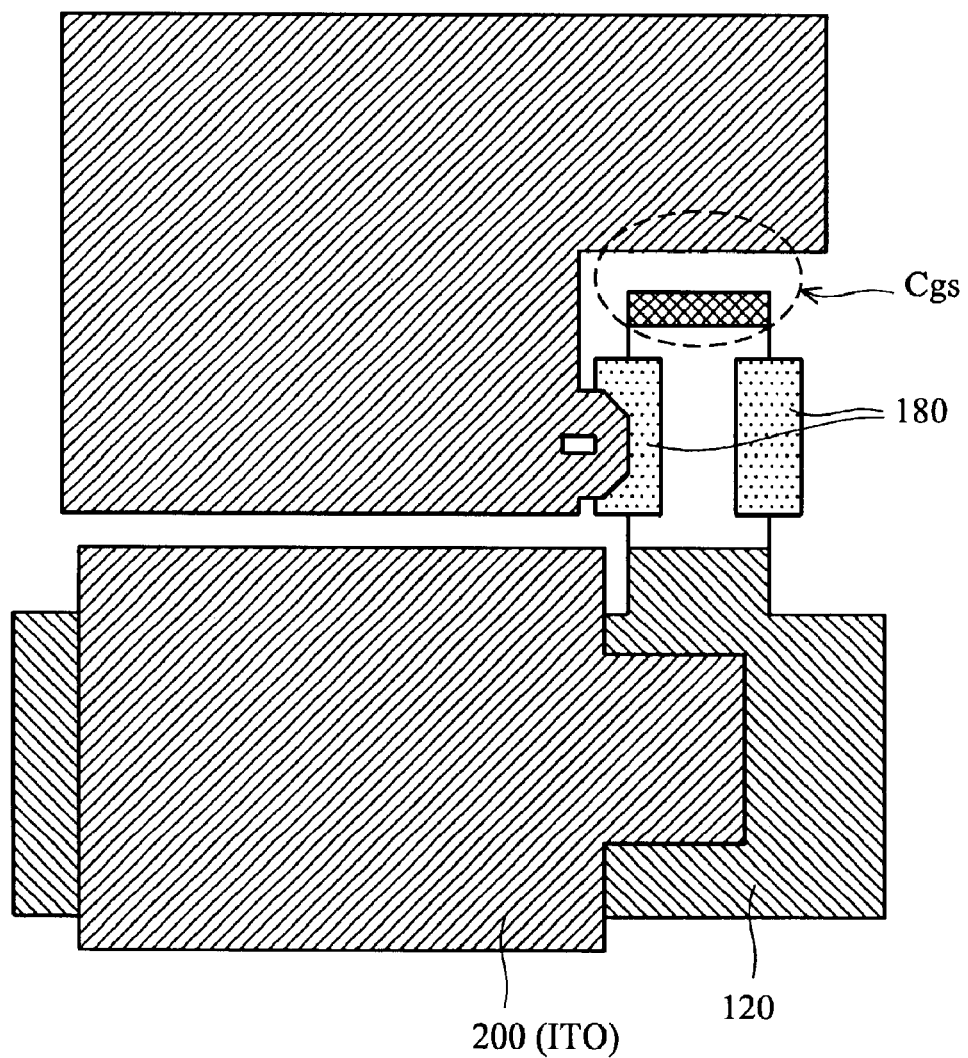
FIG. 1 is a plane view showing a layout of a conventional TFT-LCD.
Figure 2A:
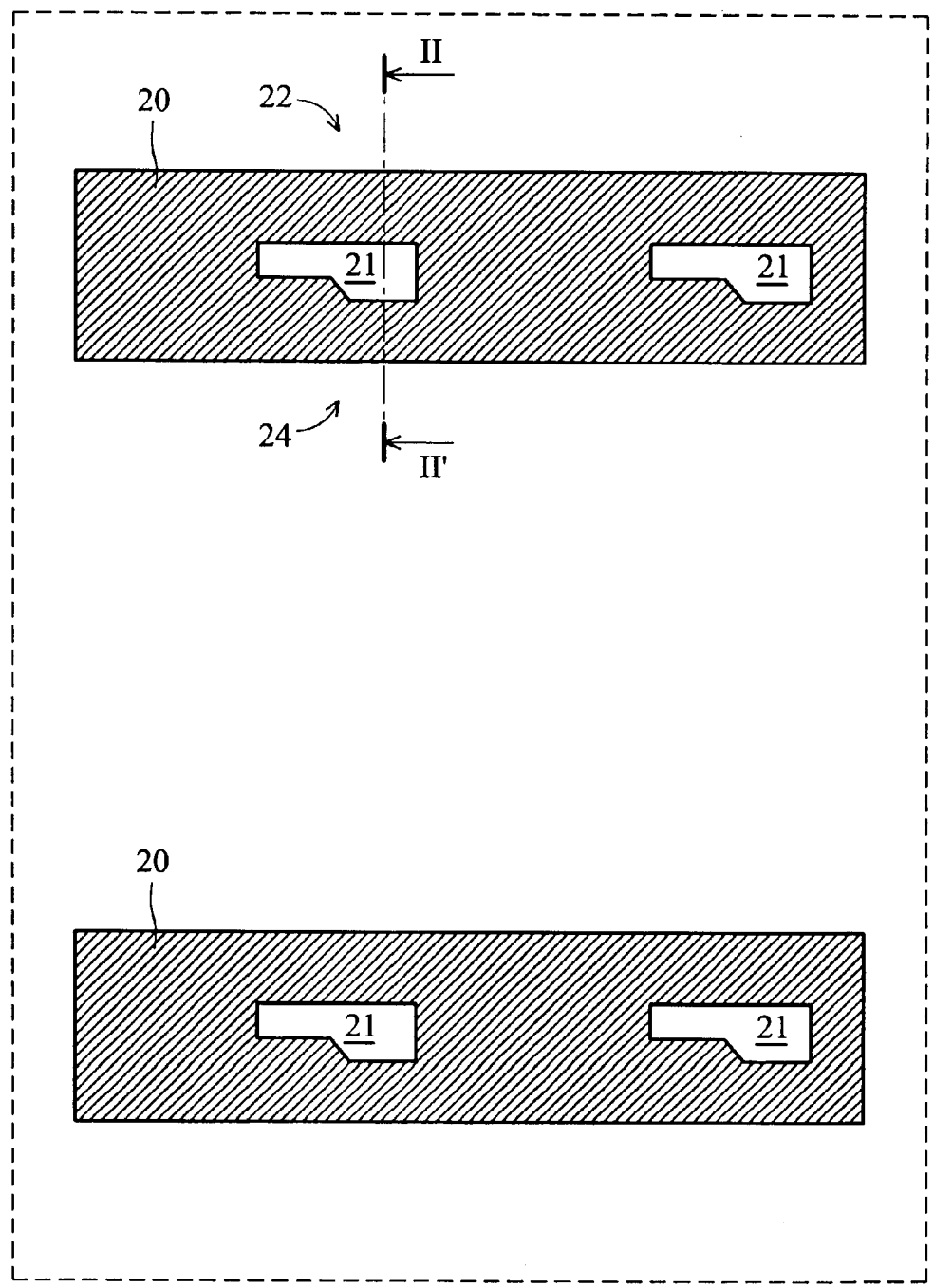
FIGS. 2A to 2E are plane views showing a method of forming a TFT-LCD according to the present invention.
Figure 2B:
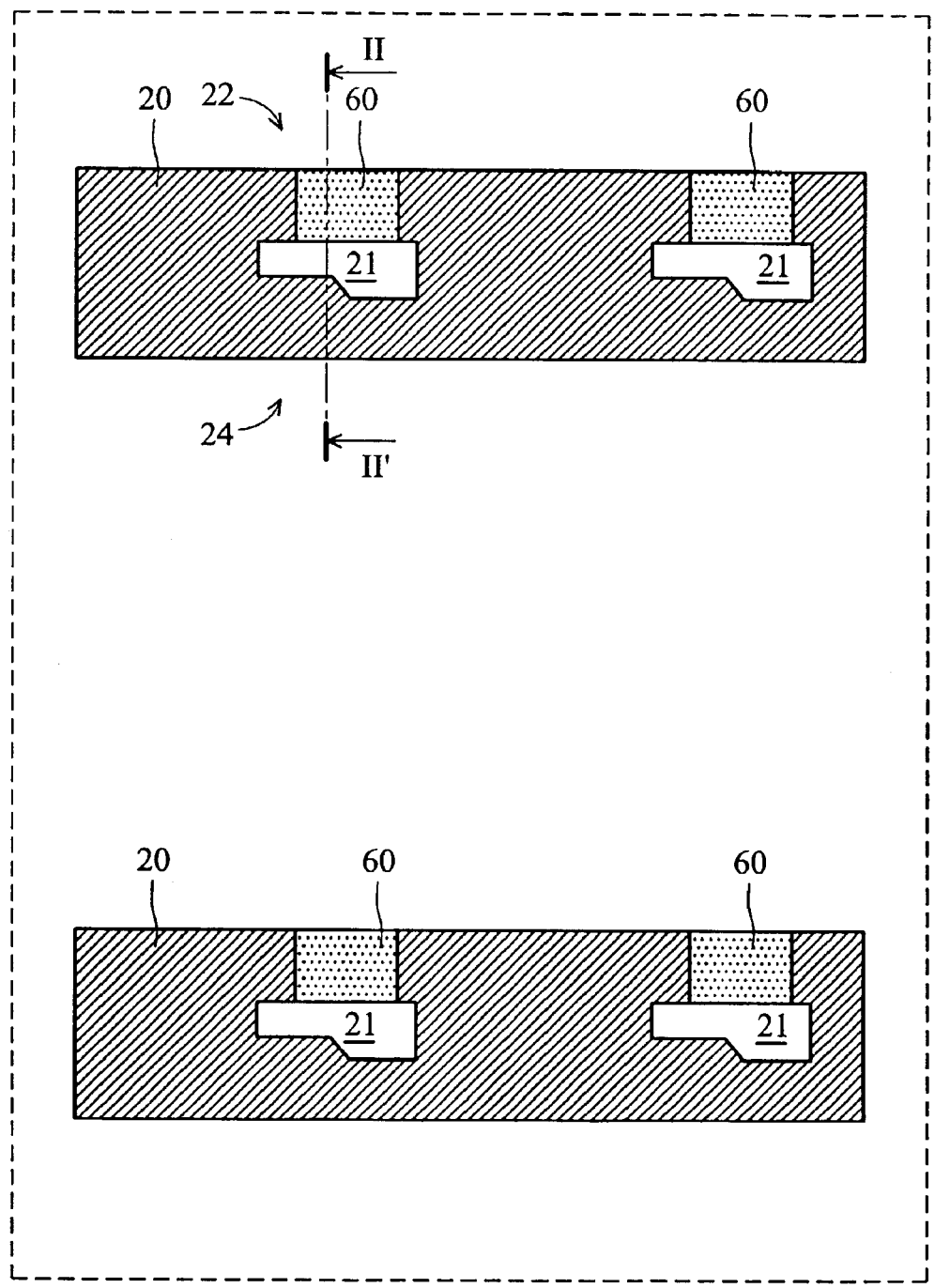
Figure 2C:
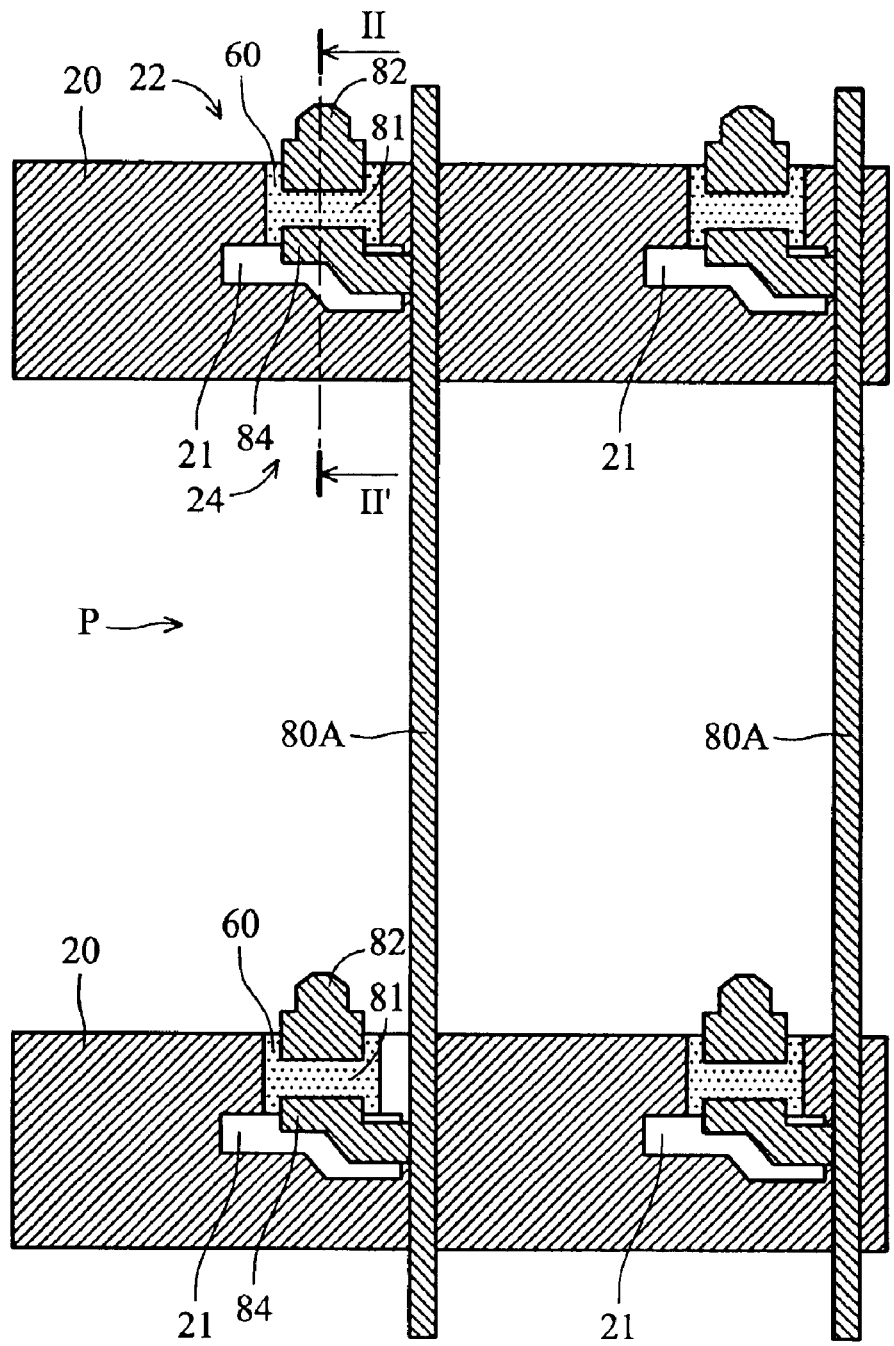
Figure 2D:
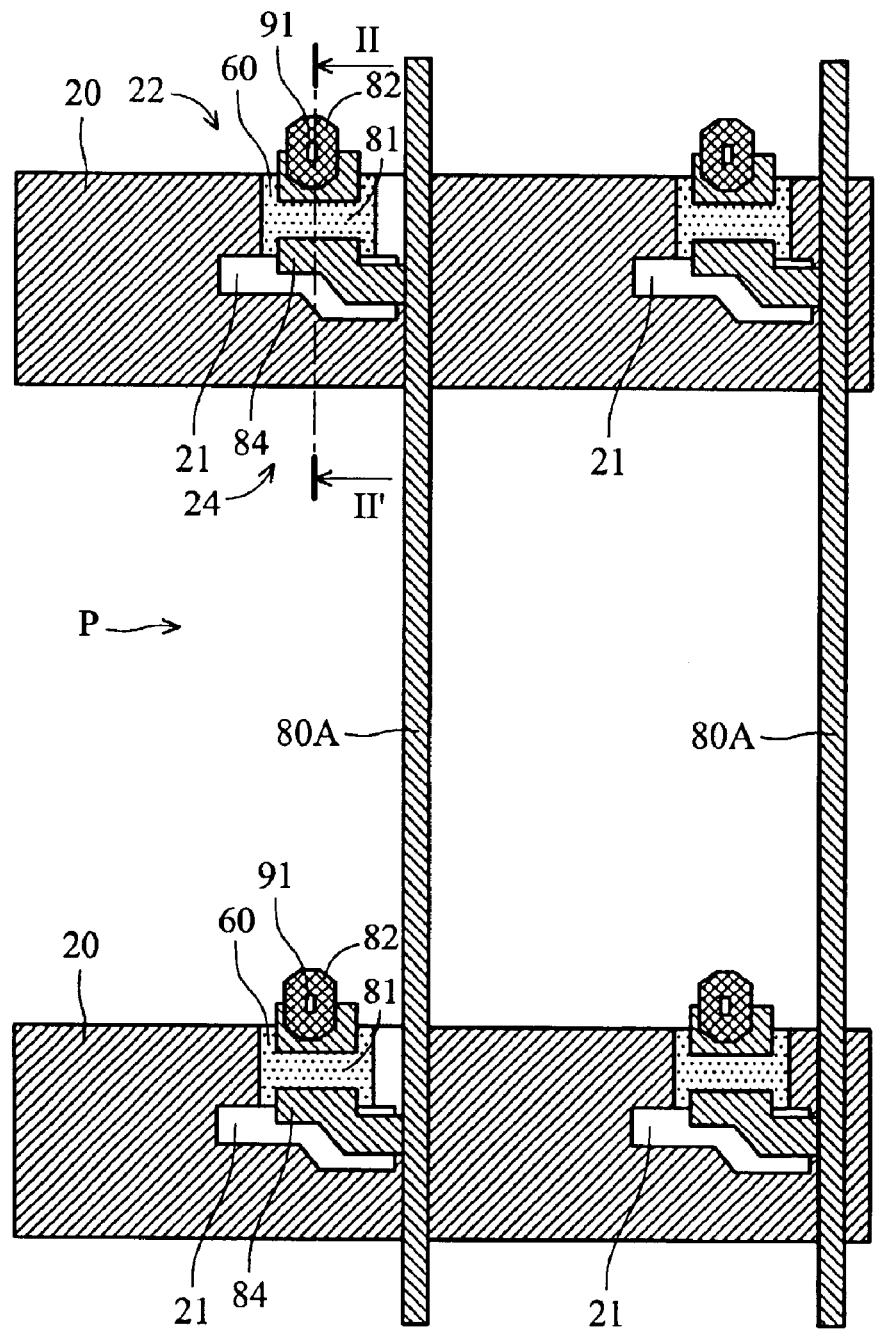
Figure 2E:
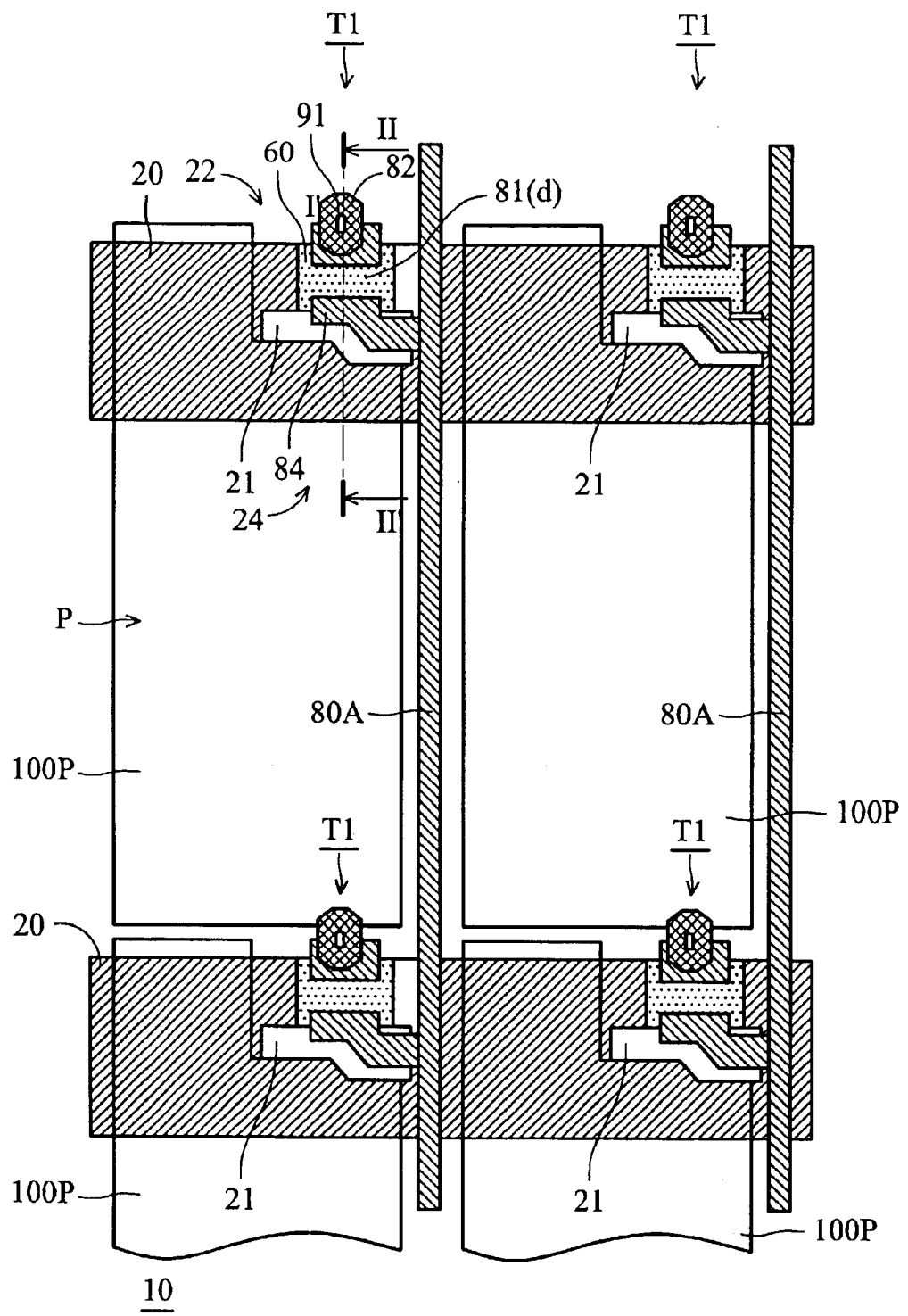

FIG. 2E, is a layout of the completed TFT-LCD according to the present invention. The TFT-LCD has a substrate 10 serving as a TFT array substrate. Preferably, a transparent material, such as glass or quartz, forms the substrate 10. Also, a plurality of traverse-extending gate lines 20 and a plurality of lengthwise-extending data lines 80A are patterned on the substrate 10 to define a plurality of pixel areas P. Moreover, each pixel area P comprises at least a TFT structure T1 and a pixel electrode 100P. Furthermore, within each pixel area P, each gate line 20 comprises an enclosed cavity 21 that separates the gate line 20 into a first gate region 22 and a second gate region 24. Depending on design choices, the form of the enclosed cavity 21 is not limited.

The TFT structure T1 comprises a gate electrode that is a part of the first gate region 22, a source electrode 84 that is an extension of the data line 80A and is disposed over the enclosed cavity 21, and a drain electrode 82 disposed over the first gate region 22 and separated from the source electrode 84 by a fixed distance d by an opening 81.

The pixel electrode 100P covers the pixel area P and is electrically connected to the drain electrode 82 through a contact hole 91. Preferably, a transparent conductive material, such, as ITO or IZO, forms the pixel electrode 100P.

Compared with the conventional TFT-LCD, the present invention provides the enclosed cavity 21 in the gate line 20 to increase the light-passing area of the TFT structure T1, resulting in an increased aperture ratio of the TFT-LCD. Also, the present invention provides most of the source electrode 84 over the enclosed cavity 21, thus the coupling capacitance Cgs between the gate electrode and the source electrode 84 exists only in the TFT structure T1, not outside the TFT structure T1 adjacent to the pixel electrode 100P. This decreases a parasitic capacitance generated between the source electrode 84 and the gate electrode (a part of the first gate region 22) to improve electrical performance (such as a decreased RC time delay) and optical characteristics (such as the elimination of flickering image).

Figure 3A:
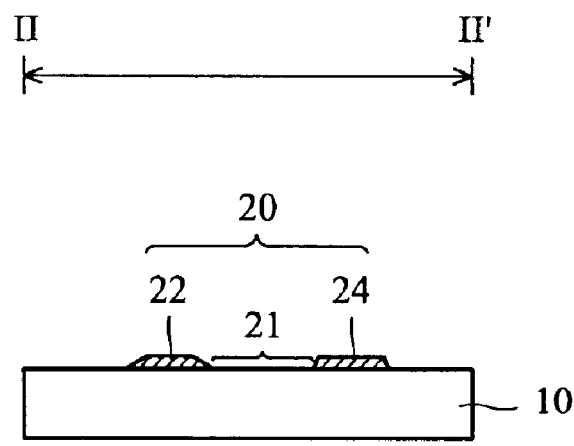
FIGS. 3A to 3G are sectional views along line II–II' of FIG. 2 to show a method of forming a TFT-LCD according to the present invention.
Figure 3B:
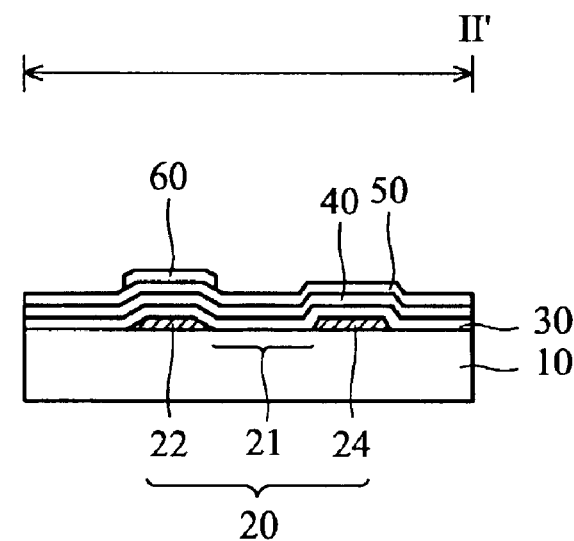
Figure 3C:
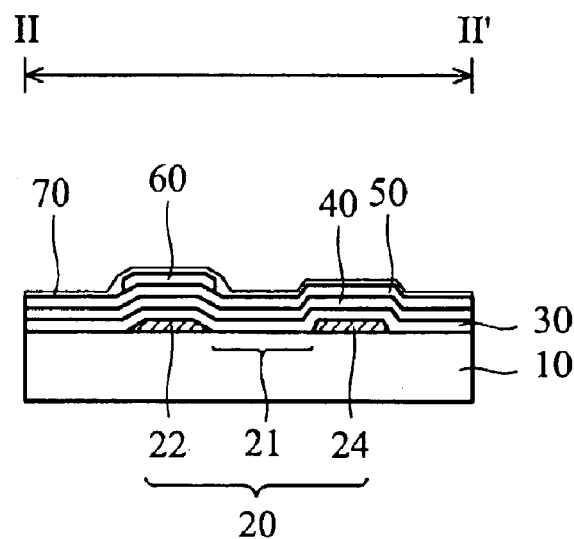
Figure 3D:
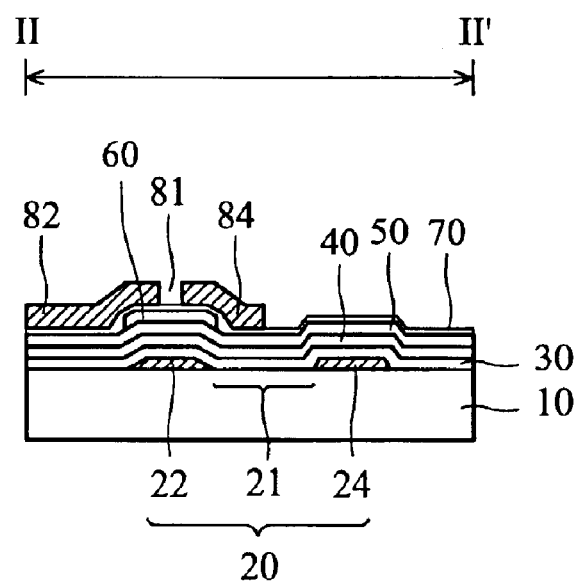
Figure 3E:
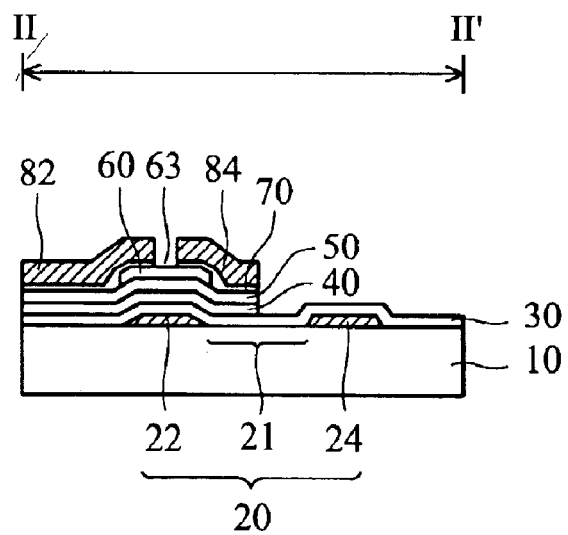
Figure 3F:
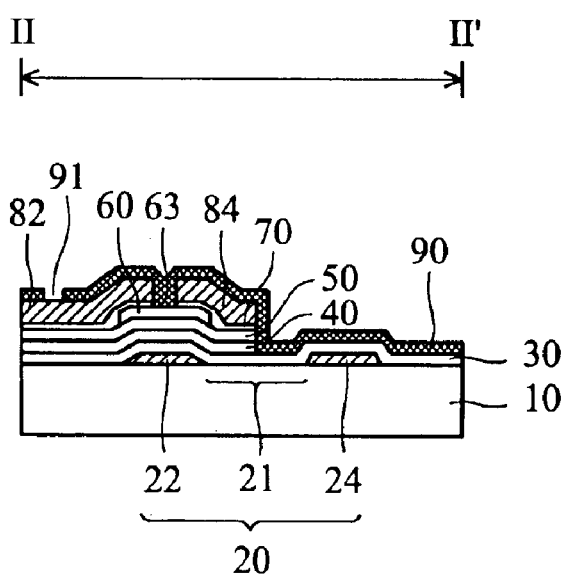
Figure 3G:
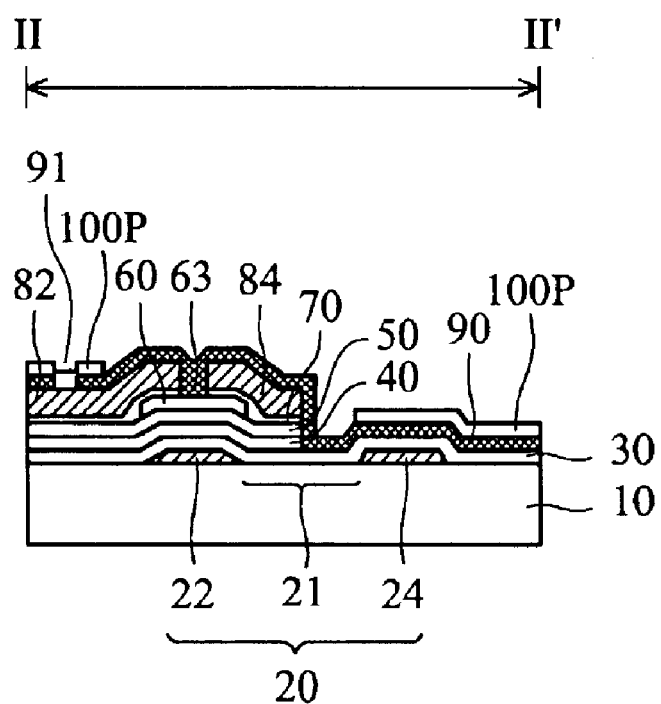

FIG. 3G is a sectional diagram along line II–II' of FIG. 2E to show the completed TFT-LCD according to the present invention. A first metal layer is patterned on the substrate 10 serves as the traverse-extending gate line 20, in which the enclosed cavity 21 is also formed to separate the gate line 20 into the first gate region 22 and the second gate region 24. Particularly, a part of the first gate region 22 is employed as the gate electrode. A first dielectric layer 30, a second dielectric layer 40, a first semiconductor layer 50, an etching stop layer 60, and a second semiconductor layer 70 are sequentially deposited and patterned on the substrate 10 to form a stacked structure over the gate electrode. The first semiconductor layer 50 is used as a channel layer. The etching stop layer 60 is formed over the gate electrode and has a profile corresponding to the profile of the gate electrode. A second metal layer is patterned as the lengthwise-extending data line 80A, the source electrode 84 on the stacked structure and over the enclosed cavity 21, and a drain electrode 82 on the stacked structure. An opening 63 is formed to pass through the second semiconductor layer 70 and the second metal layer on the stacked structure to expose a part of the etching stop layer 60, resulting in separation of the second semiconductor layer 70 as a source diffusion region and a drain diffusion region. A protection layer 90 is deposited on the entire surface to fill the opening 63, and the contact hole 91 is formed in the protection layer 90 to expose a part of the drain electrode 82. A transparent conductive layer is deposited on the entire surface to fill the contact hole, and then patterned as the pixel electrode 100P.

Hereinafter, the method of forming the aforementioned TFT-LCD is described with the layout diagrams in FIGS. 2A to 2E and sectional diagrams in FIGS. 3A to 3G.

First, as shown in FIG. 2A and FIG. 3A, a first metal layer is deposited on the substrate 10, and then patterned as the traverse-extending gate lines 20, in which the enclosed cavity 21 is also formed to separate the gate line 20 into the first gate region 22 and the second gate region 24. Particularly, a part of the first gate region 22 is employed as the gate electrode. Preferably, a transparent material, such as glass or quartz, forms the substrate 10. Depending on the sequential processes, the required transmittance and the arrangement and profile of the drain electrode, the enclosed cavity 21 has various forms.

Then, as shown in FIG. 2B and FIG. 3B, a first dielectric layer 30, a second dielectric layer 40, a first semiconductor layer 50 and an etching stop layer 60 are sequentially deposited on the substrate 10. Next, using the exisiting gate electrode profile as a mask, an exposure is employed from the backside of the substrate 10 to pattern the etching stop layer 60, thus the part of the first gate region 22 covered by the etching stop layer 60 serves as the gate electrode. Preferably, the etching stop layer 60 is patterned as a square form over the gate electrode and neighbors the enclosed cavity 21. Preferably, the first dielectric layer 30 is amorphous silicon-nitride-oxide (a-SiNO), the second dielectric layer 40 is amorphous silicon nitride (a-SiN), the first semiconductor layer 50 is amorphous hydrogenated silicon (a-Si:H), and the etching stop layer 60 is amorphous silicon-nitride-oxide (a-SiNO).

Then, as shown in FIG. 2C and FIG. 3C, a second semiconductor layer 70 is deposited on the etching stop layer 60 and the first semiconductor layer 50. Preferably, the second semiconductor layer 70 is $n^+$-doped amorphous hydrogenated silicon ($n^+$ a-Si:H).

Then, as shown in FIG. 2D and FIG. 3D, a second metal layer is deposited on the second semiconductor layer 70, and the second metal layer is patterned as the lengthwise-extending data lines 80A, the source electrode 84 and the drain electrode 82. Also, an opening 81 is formed between the source electrode 84 and the drain electrode 82 to expose the second semiconductor layer 70. Preferably, the opening 81 is over the center of the etching stop layer 60. The profile of the source electrode 84 is not limited, and preferably, the profile of the source electrode 84 matches the profile of the enclosed cavity 21.

Then, as shown in FIG. 3E, using an etching process, the exposed region of the second semiconductor layer 70 is removed to form an opening 63, and the etching stop layer 60 is thus exposed at the bottom of the opening 63. The opening 63 separates the second semiconductor layer 70 into a source diffusion region under the source electrode 84 and a drain diffusion region under the drain electrode 82. Moreover, in the same etching process, the second semiconductor layer 70 and the first semiconductor layer 50 outside the predetermined TFT structure area are removed to form an island structure.

Then, as shown in FIG. 3F, a protection layer 90 is deposited on the entire surface to fill the opening 63. Preferably, the protection layer 90 is silicon nitride. Next, using photolithography and etching a contact hole 91 is formed in the protection layer 90 to expose a part of the drain electrode 82.

Finally, as shown in FIG. 2E and FIG. 3G, a transparent conductive layer is deposited on the entire surface to fill the contact hole 91 to electrically connect the drain electrode 82. Preferably, the transparent conductive layer is ITO or IZO. Then, using photolithography and etching, the transparent conductive layer is patterned as the pixel electrode 100P.

In FIG. 2E, since the enclosed cavity 21 is positioned corresponding to the source electrode 84, the enclosed cavity 21 is disposed along a direction extending from the data line 80A toward the gate line 20. Also, the enclosed cavity 21 is in form corresponding to the source electrode 84 to decrease the overlapping area between the source electrode 84 and gate electrode.

Figure 4A:
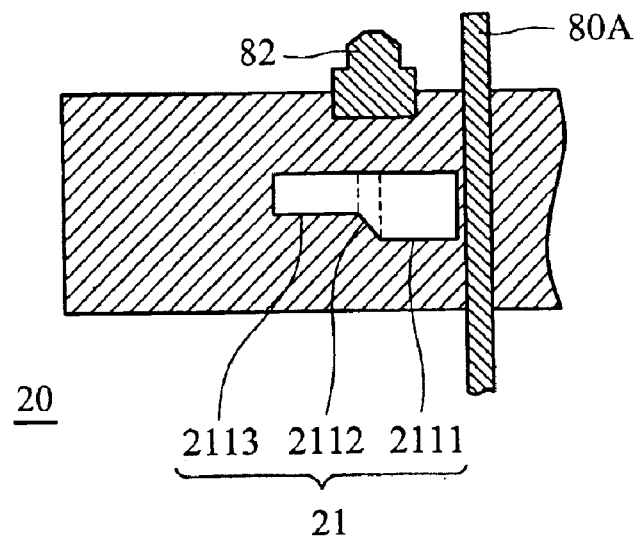
FIGS. 4A to 4F are plane views showing various forms of the enclosed cavity.

FIGS. 4A to 4F are plane views showing various forms of the enclosed cavity 21. As shown in FIG. 4A, the enclosed cavity 21 comprises a first rectangular area 2111 adjacent to the data line 80A, a trapezoidal area 2112 connected to the first rectangular area 2111, and a second rectangular area 2113 connected to the trapezoidal area 2112. To increase the aperture ratio and ensure the overlapping area is between the source electrode 84 and the enclosed cavity 21, it is preferred to increase the width of the first rectangular area 2111. Therefore, in one case, the first rectangular area 2111 is wider than the trapezoidal area 2112 and the second rectangular area 2113. That is, as shown as FIG. 4A. a lengthwise-direction length of the first rectangular area 2111 is greater than that of the second rectangular area 2113 and thus the first rectangular area 2111 is greater than the second rectangular area 2113.

Figure 4B:
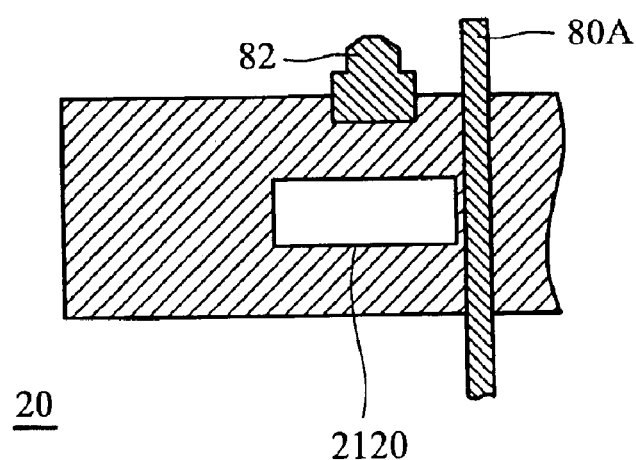

As shown in FIG. 4B, the enclosed cavity 21 is a rectangular area 2120 perpendicularly adjacent to the data line 80A. The size of the rectangular area 2120 can be adjusted according to the required transmittance or aperture ratio of the TFT-LCD.

Figure 4C:
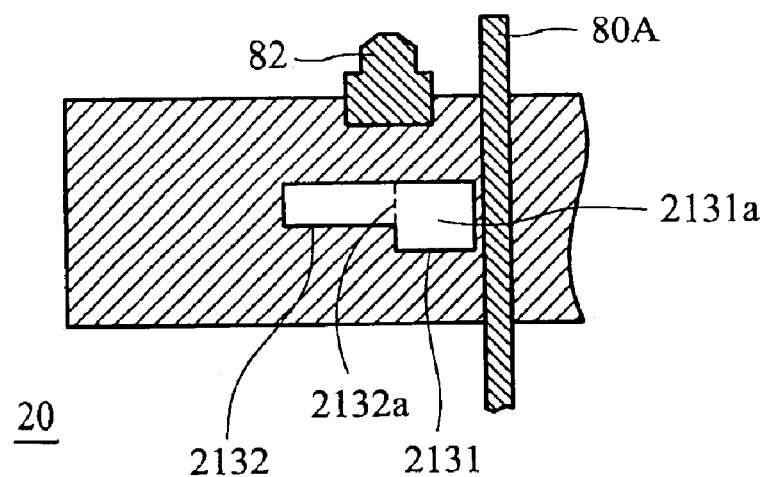

As shown in FIG. 4C, the enclosed cavity 21 is an L-shaped form that comprises a first rectangular area 2131 adjacent to the data line 80A, and a second rectangular area 2132 connected to the first rectangular area 2131. Preferably, the shorter side of the second rectangular area 2132 is at the connecting boundary 2132a, and the longer side of the first rectangular area 2131 is at the connecting boundary 2132a. Also, the size of the L-shaped form can be adjusted according to the required transmittance or aperture ratio of the TFT-LCD.

Figure 4D:
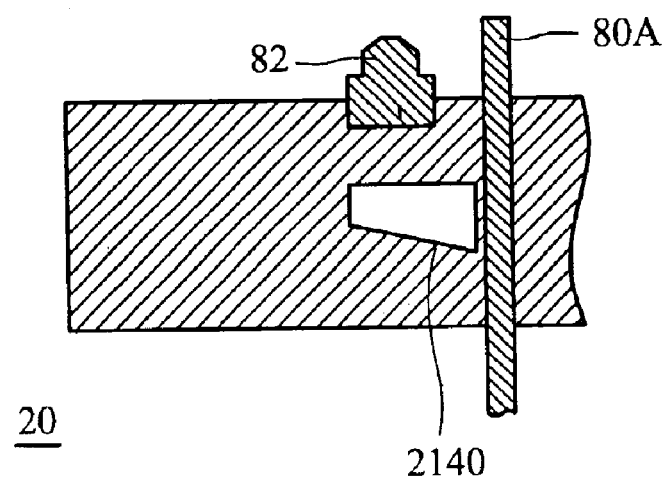

As shown in FIG. 4D, the enclosed cavity 21 is a trapezoidal area 2140 adjacent to the data line 80A. The size of the trapezoidal area 2140 can be adjusted according to the required transmittance or aperture ratio of the TFT-LCD.

Figure 4E:
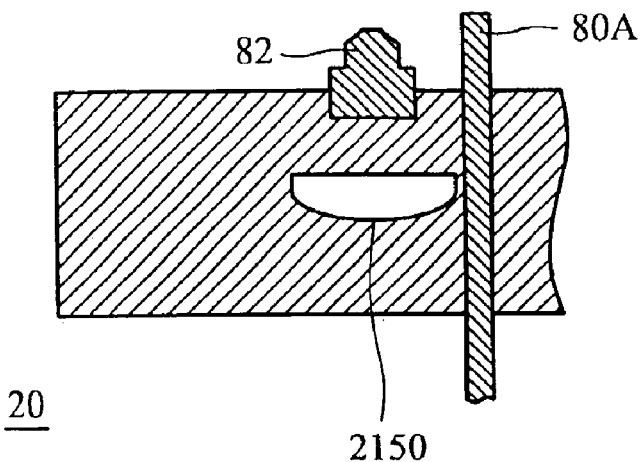

As shown in FIG. 4E, the enclosed cavity 21 is a semicircular area 2150 adjacent to the data line 80A. The size of the semicircular area 2150 can be adjusted according to the required transmittance or aperture ratio of the TFT-LCD.

Figure 4F:
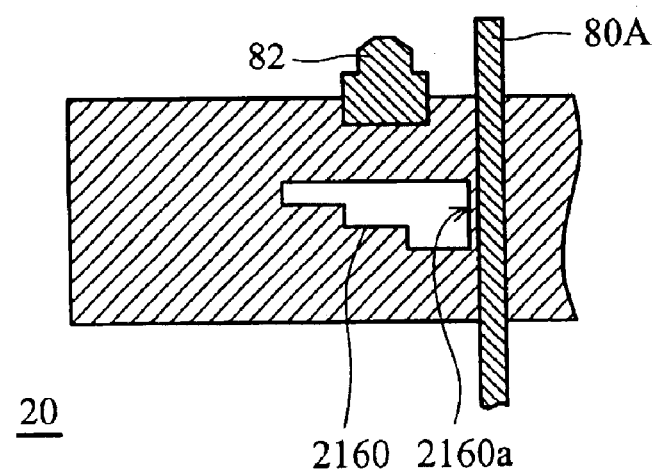

As shown in FIG. 4F, the enclosed cavity 21 is a ladder-shaped area 2160, and the bottom of the ladder-shaped area 2160 is adjacent to the data line 80A. The size of the ladder-shaped area 2160 can be adjusted according to the required transmittance or aperture ratio of the TFT-LCD.

The present invention provides the enclosed cavity 21 in the gate line 20 to increase the light-passing area of the TFT structure T1, resulting in an increased aperture ratio of the TFT-LCD. Also, the present invention provides most of the source electrode 84 over the enclosed cavity 21, thus the coupling capacitance Cgs between the gate electrode and the source electrode 84 exists only in the TFT structure T1, not outside the TFT structure T1 adjacent to the pixel electrode 100P. This decreases a parasitic capacitance generated between the source electrode 84 and the gate electrode (a part of the first gate region 22) to improve electrical performance (such as a decreased RC time delay) and optical characteristics (such as the elimination of flickering image). Moreover, compare with a tongue-type TFT that stretches out toward a pixel in the prior art, the present invention employs the TFT structure T1 to traverse dispose over the gate line 20, thus evidently increasing aperture ratio and transmittance of the TFT-LCD.

The form and location of the enclosed cavity 21 can be modified depending on subsequent processes to increases process window. Also, the size of the enclosed cavity 21 can be modified depending on the transmittance of the TFT structure. Furthermore, the form and location of the enclosed cavity 21 can be modified to match those of the source electrode to decrease a parasitic capacitance.

It is to be understood that the present invention is not limited to the embodiments described above, but encompasses any and all embodiments within the scope of the following claims.

What is claimed is:

1. A thin film transistor liquid crystal display, comprising:

at least one gate line extending along a first direction and at least one data line extending along a second direction that intersect to define at least one pixel area, wherein an enclosed cavity is formed in the gate line to separate the gate line into a first gate region and a second gate region; a thin film transistor comprising a gate electrode that is the first gate region or the second gate region, a source electrode that is an extension of the data line and is over the enclosed cavity, and a drain electrode; and a pixel electrode covering the pixel area and electrically connected to the drain electrode;

wherein the enclosed cavity is a polygonal cavity and at least comprises a first area adjacent to the data line and a second area connected to the first area;

wherein the enclosed cavity is a semicircular profile or a ladder-shaped profile.

2. A thin film transistor liquid crystal display, comprising:

a substrate;

a first metal layer patterned on the substrate serves as at least a traverse-extending gate line, wherein an enclosed cavity is formed in the gate line to separate the gate line into a first gate region and a second gate region, and a part of the first gate region serves as a gate electrode;

a stacked structure comprising a dielectric layer, a first semiconductor layer, an etching stop layer and a second semiconductor layer sequentially formed on the gate electrode and the substrate, in which the etching stop layer is positioned corresponding to the gate electrode;

a second metal layer patterned on the substrate serves as at least a lengthwise-extending data line, a source electrode on the stacked structure and over the enclosed cavity, and a drain electrode on the stacked structure, wherein an opening passes through the second metal layer to separate the source electrode and the drain electrode, and the opening passes through the second semiconductor layer to separate the second semiconductor layer into a source diffusion region and a drain diffusion region;

a protection layer deposited on the entire surface to fill the opening, wherein a contact hole is formed in the protection layer to expose a part of the drain electrode; and a transparent conductive layer deposited on the entire surface to fill the contact hole and patterned as a pixel electrode electrically connected to the drain electrode through the contact hole;

wherein the enclosed cavity is a polygonal cavity and at least comprises a first area adjacent to the data line and a second area connected to the first area;

wherein the enclosed cavity is a semicircular profile or a ladder-shaped profile.

3. The thin film transistor liquid crystal display according to claim 1, wherein a profile of the first area and the second area corresponds to a profile of the source electrode.

4. The thin film transistor liquid crystal display according to claim 2, wherein the substrate is a glass or quartz substrate.

5. The thin film transistor liquid crystal display according to claim 2, wherein the dielectric layer comprises amorphous silicon-nitride-oxide or amorphous silicon nitride.

6. The thin film transistor liquid crystal display according to claim 2, wherein the first semiconductor layer comprises amorphous hydrogenated silicon.

7. The thin film transistor liquid crystal display according to claim 2, wherein the etching stop layer comprises amorphous silicon-nitride-oxide.

8. The thin film transistor liquid crystal display according to claim 2, wherein the second semiconductor layer comprises $n^+$-doped amorphous hydrogenated silicon.

9. The thin film transistor liquid crystal display according to claim 2, wherein the protection layer comprises silicon nitride.

10. The thin film transistor liquid crystal display according to claim 2, wherein the transparent conductive layer is an ITO or IZO layer.

* * * * *